United States Patent [19]

Chambers et al.

[11] 4,066,977

[45] Jan. 3, 1978

[54] DIGITIZED AGC AMPLIFIER WITH GAIN HYSTERESIS CIRCUIT

[75] Inventors: Ramon P. Chambers, Clearwater; David E. Sanders, St. Petersburg; Robert S. Gordy, Largo, all of Fla.

[73] Assignee: E-Systems, Inc., Dallas, Tex.

[21] Appl. No.: 671,846

[22] Filed: Mar. 30, 1976

[51] Int. Cl.² .......................................... H03G 3/20
[52] U.S. Cl. .................................................. 330/129
[58] Field of Search ................... 330/29, 86, 127, 129, 330/144, 145

[56] References Cited

U.S. PATENT DOCUMENTS

| | | | |
|---|---|---|---|
| 3,464,022 | 8/1969 | Locheed et al. | 330/144 |
| 3,757,242 | 9/1973 | Law et al. | 330/127 |
| 3,828,262 | 8/1974 | Trocqueme | 330/86 X |
| 3,879,672 | 4/1975 | Milanes | 330/129 X |
| 3,969,683 | 7/1976 | Fabricius | 330/144 |

Primary Examiner—James B. Mullins
Attorney, Agent, or Firm—Robert V. Wilder

[57] ABSTRACT

A digitized automatic gain controlled amplifier and gain hysteresis circuit is disclosed for preserving a low frequency, low level modulation at the output of an AGC amplifier while also providing for rapid correction of amplifier gain for large variations in the amplifier input signal level. The described amplifier is particularly adapted to satellite communications systems in which ionospheric changes produce rapid power fades and wherein satellite tracking is accomplished by dithering a high-gain antenna on the satellite to produce a low-frequency power amplitude control signal at the input to the AGC amplifier, which control signal is allowed to pass through to a control system while the larger input signal variations are gain-controlled out.

10 Claims, 5 Drawing Figures

DIGITIZED AGC AMPLIFIER WITH GAIN HYSTERESIS CIRCUIT

BACKGROUND OF THE INVENTION

1. Field of the Invention

The present invention relates generally to digital amplifiers and more specifically to digital AGC amplifiers having a large AGC range capability to correct for large amplitude variations in input signal level, whether occurring rapidly or slowly, while simultaneously preserving at the amplifier output a low level, low frequency modulation, such as amplitude modulation, on the input signal. The present invention also relates to receiver circuitry particularly suitable for use in satellite communications systems wherein ionospheric disturbances, such as ionospheric scintillation, cause large and rapid signal fades which must be gain controlled out, while simultaneously preserving the low level low frequency dither signal from the satellite tracking antenna. The present invention also relates generally to analog-to-analog or analog-to-digital conversion circuitry wherein large variations in input signal level are rapidly corrected while small input signal level variations within a predetermined range are preserved.

2. Description of the Prior Art

A variety of digital AGC amplification techniques are present in the prior art for providing rapid automatic gain control for fluctuation in input signal level. However, in certain applications, a low level low frequency variation in the power level must be preserved at the amplifier output. The preservation of such a low level modulation is critical in satellite communications in which rapid power fades occur concurrently while tracking the satellite with a high gain disk antenna, dithered on the target at a low frequency, i.e. 10 Hertz, which dithering produces the aforementioned low frequency power amplitude variation. The antenna control signal, at the AGC amplifier input, must pass through the amplifier to the antenna control system and be preserved while gain controlling out large random signal level variations. Amplifiers of the known prior art, while effectively smoothing large fluctuations in the input signal level, do not preserve the aforementioned low level low frequency modulation at the amplifier output, while simultaneously providing rapid AGC.

Representative of the prior art as characterized hereinabove, U.S. Pat. No. 3,434,065 describes an AGC amplifier wherein all input power variations within the amplifiers dynamic range are tracked out once the controlled output level reaches a threshold value. U.S. Pat. No. 3,683,367 describes a digital AGC amplifier for use with input data signals which dwell on either a maximum or minimum level for a significant time duration. U.S. Pat. No. 3,879,672 describes a digital AGC circuit for providing rapid gain changes in response to rapid changes in input signal amplitude. U.S. Pat. No. 3,898,580 describes a dual time constant phase lock oscillator including a stepwise gain variable operational amplifier.

SUMMARY OF THE INVENTION

The present invention comprises a circuit for converting a continuously variable AGC voltage (CVAGC) into a digitized control voltage which changes to match the CVAGC only when the input signal variation is greater than a predetermined magnitude determined by the amplifier gain hysteresis loop, which serves to preserve a desired low frequency amplitude modulation, while also providing rapid gain correction for larger input signal variations. In a communications receiver, rapid correction of amplifier gain with changing input signal level is provided without tracking out low frequency low level modulation, such as the amplitude modulation resultant from an antenna dither signal. Such low level modulation is allowed to pass through an AGC controlled amplifier with no lower limit on the AM modulation frequency so long as the gain hysteresis range is not exceeded.

It is therefore an object of the present invention to provide a new and improved digitized AGC amplifier and gain hysteresis circuit for preserving a low frequency, low level modulation at the amplifier output while concurrently providing AGC for rapidly correcting the amplifier gain for large variations in input signal level.

It is another object of the present invention to provide a novel gain hysteresis circuit for use in conjunction with an AGC amplifier.

It is another object of the present invention to provide a new and improved receiver for use in a satellite communications system in which the transmitted output signal incorporates a low frequency amplitude modulation conveying antenna positioning information, which information is passed through the receiver amplifier while larger input signal changes are tracked out.

It is another object of the present invention to provide a circuit for digitizing an AGC voltage to retain a low frequency low modulation index signal at the output of an AGC amplifier.

It is yet another object of the present invention to provide an improved analog-to-analog or analog-to-digital conversion circuit in which the circuit signal output is not subject to change for analog input voltage changes below a predetermined magnitude.

The foregoing and other objects, features and advantages of the invention will become apparent with reference to the following detailed description of the preferred embodiments thereof, taken in connection with the accompanying drawings wherein:

DESCRIPTION OF THE PREFERRED EMBODIMENT

Figure 1:
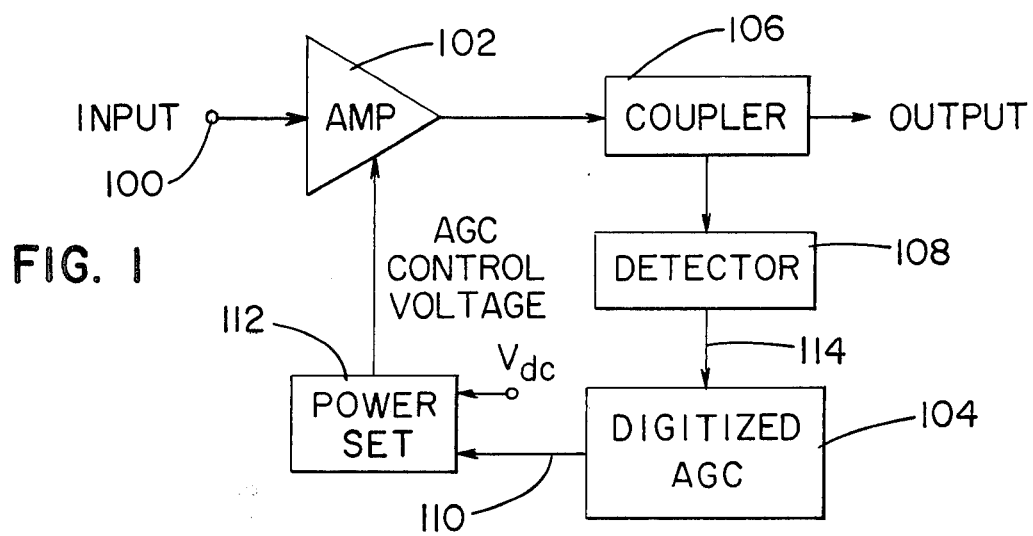
FIG. 1 is a simplified block diagram of a system incorporating the AGC amplifier and gain hysteresis circuit of the present invention.

Referring now to FIG. 1, a block diagram of the invention as incorporated in an rf receiver is illustrated. The input signal received at terminal 100 may, in a satellite communications system, be a transmitted and transponded phase shift keyed (PSK) signal incorporating a low frequency (approximately ten Hertz) amplitude modulation of the PSK signal to convey antenna positioning data (hereinafter referred to as the antenna dither signal). This input rf signal, as aforedescribed, is subject to rapid and large input signal changes caused by, among other phenomena, ionospheric scintillation. The input on line 100 is described, for illustrative purposes, as an rf signal with a low level low frequency amplitude modulation impressed thereon; however, it is to be understood that other modulation might be employed. Amplifier 102 has coupled thereto the aforementioned rf input such that the instantaneous signal amplitude is a function of both the specified low frequency low level amplitude modulation and random variations in input signal level. Amplifier 102, which may comprise an rf amplifier with provision for electronic gain control, has the rf input coupled thereto. In such amplifiers, a control voltage serves to set the amplifier gain. As described hereinafter, a uniquely derived AGC control voltage is derived by a digitized gain control circuit 104 to maintain the gain of amplifier 102 such that the rf signal output level therefrom is kept within a specified and predetermined range, the low frequency low level amplitude modulation thereon is preserved and a rapid gain correction capability is provided for any random input amplitude changes which are of greater magnitude than a predetermined value, such as the desired modulation level. The aforedescribed output signal from amplifier 102 is coupled to a signal coupler 106, which coupler may be of the bridging type, either resistive, capacitive, inductive, or a hybrid-Tee. Coupler 106 could also be a part of the output circuitry of amplifier 102; however, it is sufficient that coupler 106 serves to couple part of the rf signal to an rf detector 108, which rectifies and filters the rf signal to provide a detector output which varies as a function of the rf signal level; and to couple the remainder of the amplifier 102 output to any desired utilization means. In the described embodiment, detector 108 may include both an amplitude detector and another amplifier, if required, to amplify the low level modulation (the dither amplitude) coupled to the input of digitized AGC circuit 104, described more particularly with reference to FIG. 2.

Operationally, the digitized AGC circuit 104 derives an output on line 110 which changes in discrete steps, as will be described with reference to FIG. 2, in such manner as to follow any changes in the output of rf detector 108 which are of a magnitude greater than that allowed by the gain hysteresis range of a pair of comparators within circuit 104. When the output of rf detector 108 is less than the gain hysteresis range, the digitized output of AGC circuit 104 remains set at its last stable value, and is compared to a reference power level at a standard power set and amplifier interface circuit 112. Interface circuit 112 compares the output of AGC circuit 104 to a dc reference voltage, amplifies the AGC output and translates it to a voltage level which is compatible with the gain control circuitry of amplifier 102. Power set 112 may comprise any amplifier having sufficient gain at the low frequency range to translate the gain control voltage to amplifier 102, and may comprise a differential amplifier. The interposition of the digitized AGC circuit 104 between rf detector 108 and the power set 112 insures that the digitized AGC hysteresis range will correspond to a fixed and predetermined percentage level change regardless of the rf input signal level, provided the input signal level is within the AGC capability of amplifier 102.

Figure 2:
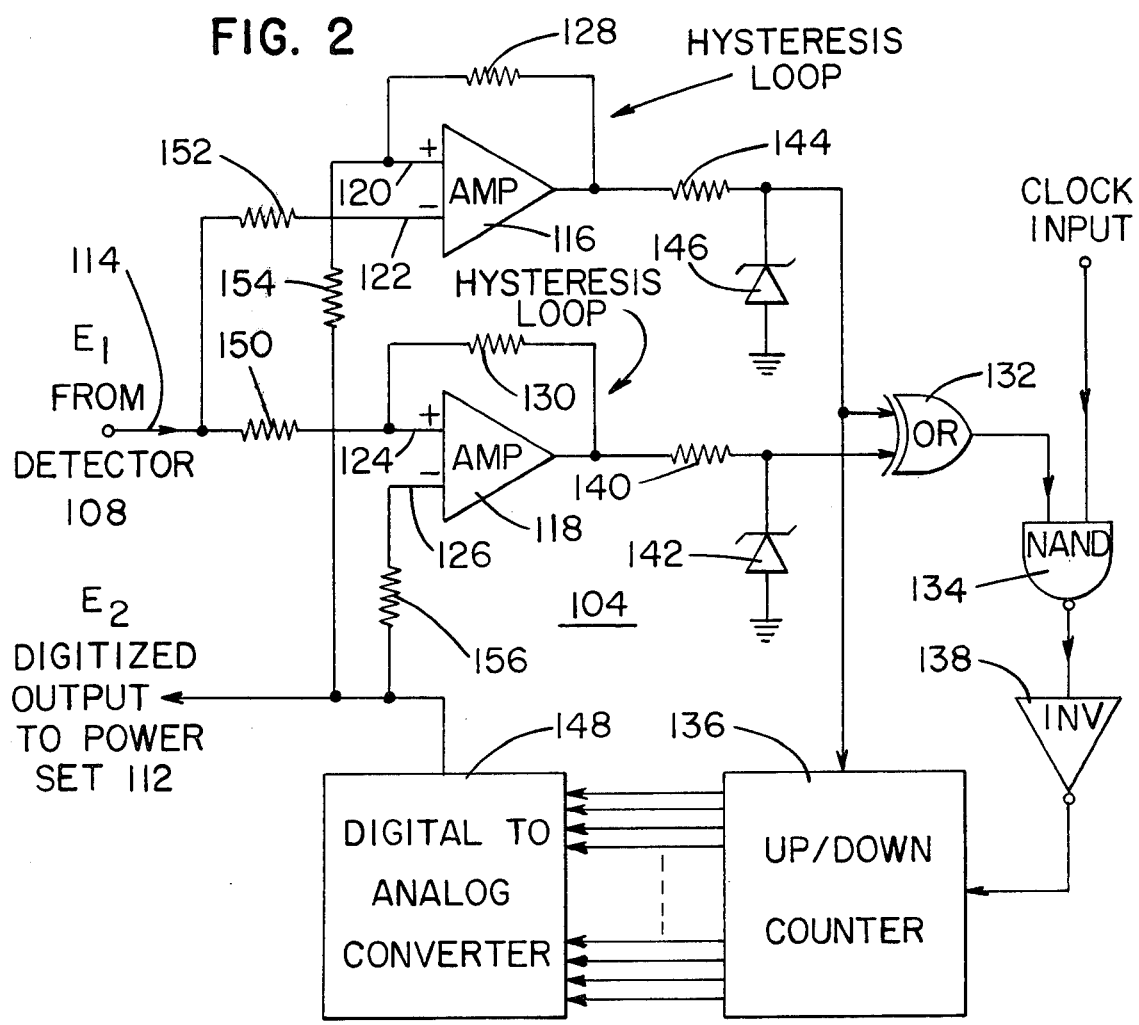
FIG. 2 is a combined block and circuit diagram of a digitized AGC and gain hysteresis circuit of the present invention.

Referring now to FIG. 2, a digitized AGC circuit in accordance with the present invention is illustrated generally at 104. The output of detector 108 on line 114 is coupled to the inverting and noninverting inputs of a pair of amplifiers 116 and 118, with inputs 120 and 122 being the noninverting and inverting inputs respectively of amplifier 116 and inputs 124 and 126 being the noninverting and inverting inputs respectively of amplifier 118. Amplifiers 116 and 118 are utilized as comparators with gain hysteresis loops provided by resistor 128 for amplifier 116 and resistor 130 for amplifier 118. Gain hysteresis may be defined as a range of input signal variation over which the amplifier gain as a whole will not vary. Amplifiers 116 and 118 may comprise, for example, differential amplifiers having a frequency range under one megacycle for zero db open loop gain, such as Motorola part MC1558, or any suitable operational amplifier as available from a number of manufacturers.

When the output voltages of amplifiers 116 and 118 are either both positive (a logical high) or both negative (a logical low), the output of an exclusive OR gate 132 is low (a logical zero) which serves to disable NAND gate 134, which NAND gate 132 has coupled thereto, in addition to the output of exclusive OR gate 132, the input clock. When NAND gate 134 is disabled, an up-down counter 136 clocked by the input clock is also disabled, as it is prevented from receiving the input clock. When the outputs of amplifiers 128 and 130 are not of the same polarity, the output of OR gate 132 is a logical "one", thereby enabling NAND gate 134 to gate through the clock pulses to up/down counter 136 via inverter 138. The direction of the count (UP or DOWN) is determined by the polarity of the output of amplifier 116, i.e., whether the output is logically high or low, such that for a negative output from amplifier 116, counter 136 counts up at the clock rate, while for a positive output, counter 136 counts down, also at the clock rate. Alternatively, the counter 136 could have a reversed up-down characteristic, in which case the output of amplifier 118, coupled through resistor 140 and zener diode 142 is applied to the input of counter 136. The outputs of amplifiers 116 and 118 are converted to TTL compatible voltage levels by resistor 144 and zener 146 for amplifier 116 and by resistor 140 and zener 142 for amplifier 118. In the event that CMOS logic rather than TTL logic were to be employed, resistors 140 and 144 and zeners 142 and 146 could be eliminated, so long as the output voltage swing of amplifiers 116 and 118 were compatible with the CMOS logic levels. Returning to the description of the illustrated TTL embodiment, inverter 138 is required only in the event that the count of counter 136 occurs on a rising clock signal, and serves to prevent counter 136 from being clocked when the output of exclusive OR 132 switches from high (one) to low (zero) in coincidence with a high clock input to NAND gate 134. This transition (the switching of OR gate 132) corresponds to the output of digital to analog converter 148 (hereinafter called $E_2$) being at a voltage level within the gain hysteresis range of the analog input signal level from detector 108 (hereinafter called $E_1$), during which occurrence further clocking of counter 136 is not desired since it is not desired to adjust the amplifier gain for signal variation in the gain hysteresis range. The output $E_2$ changes in discrete steps set by the least significant bit of the D/A converter 148 in such manner as to follow any variation in the rf detector 108 output greater than that permitted by the gain hysteresis range of amplifiers 116 and 118. The thus digitized AGC output of D/A converter 148 cannot change by more than the least significant bit supplied to D/A 148 unless the input signal level exists for a time duration greater than the time period of the clock. In the event that voltage $E_1$ should increase or decrease beyond the gain hysteresis band of its previously stabilized point, the switching of exclusive OR gate 132 from a "zero" to a "one" will also clock counter 136 when the clock input to NAND gate 134 is high. Subsequent clocking of counter 136 when the output of exclusive OR gate 132 is high depends upon the incoming clock. At each clocking of counter 136, the output of D/A 148 changes in discrete steps equivalent to the LSB of the digital input to D/A 148. (Up/down counter 136 may comprise of multiple four bit devices to achieve the required bits for the D/A converter 148 as set by the range of $E_1$ and the LSB dictated by the hysteresis band. Both devices are available from Texas Instruments, Fairchild Semiconductor and Motorola, among others.)

Considering the case in which the input $E_1$ is high with respect to $E_2$ by more than the gain hysteresis range i.e, an amplitude change greater than the dither modulation amplitude; then the output of amplifier 118 is high (positive) and the output of amplifier 116 is low (negative). This condition results in exclusive OR 132 having a high (logical one) output which enables NAND gate 134, thereby permitting the clock input to clock the up/down counter 136. Since the output of amplifier 116 is low, counter 136 counts up thereby increasing the output of D/A 148. So long as the analog equivalent of the LSB of counter 136 is small enough not to sufficiently overshoot the desired digitized output voltage $E_2$, which voltage overshoot would cause both amplifiers 116 and 118 to switch states, amplifier 118 will change state first, going from a high output to a low output, thereby disabling NAND gate 134 and stopping the count of counter 136. The final value of $E_2$ will then be of greater magnitude than $E_1$ by a value depending upon the gain hysteresis feedback factor $M$, where:

$$M = R150/R130 = R154/R128$$

It is noted that amplifiers 116 and 118 may be designed to have gain hysteresis factors other than as determined by the above ratios; however, for simplicity of design, the above hysteresis gain factor is preferred. The final value of $E_2$ is also dependent upon the magnitude of the output of amplifier 118 and upon the value of $E_1$ itself. Continuing with this example, with amplifier 118 output low and amplifier 116 output low, voltage $E_1$ can either increase or decrease. Assuming that $E_1$ is substantially lesser in magnitude than the magnitude of the output voltages of amplifiers 116 and 118, a relatively small decrease in the magnitude of $E_1$ will cause amplifier 116 to change state (from low to high) thereby initiating counter 136 to count down which then decreases $E_2$. Counter 136 will continue counting down until $E_2$ reaches a magnitude less than the stable value of $E_1$ by an amount dependent upon circuit parameters, including $E_1$ and the output of amplifier 116. At this point, amplifier 116 will change state (from high to low), stopping the down count with the same restriction in the incremental change in $E_2$ as described hereinabefore.

If $E_1$ should increase from the original stabilized point, i.e., amplifiers 116 and 118 outputs both low, a relatively large increase in the magnitude of $E_1$ would be required before the amplifier 118 changed state, (from low to high) and the counter 136 counted up. When $E_2$ reached a magnitude greater than the magnitude of $E_1$, which represents the switching point for amplifier 118 to change state back to a low output, the count is stopped. The gain hysteresis range equivalent to the range that $E_1$ must change before either amplifiers 116 or 118 changes state to enable the clocking of up/down counter 136, must be equal to or greater than the change in magnitude of $E_1$ associated with the amplitude modulation that is to be preserved. Even if this condition were not met, the amplitude modulation to be preserved would still be present at the output of D/A 148, but would be distorted.

In the event that the detector 108 output $E_1$ should initially start lower than $E_2$ by more than the gain hysteresis range, the output of amplifier 118 is low (negative) and the output of amplifier 116 is high (positive), which results in NAND gate 134 being enabled and counter 136 downcounting until $E_2$ reaches the magnitude at which amplifier 116 will change state first, with the $E_2$ incrementation being as aforedescribed. Amplifier 116 will then switch from high to low, inhibiting the the clocking of counter 136 by disabling NAND gate 134. The $E_2$ output is then lower than $E_1$ by a magnitude dependent upon the gain hysteresis factor, the magnitude of the output of amplifier 116 and $E_1$. At this point, both amplifier 116 and 118 outputs being low, a much larger decrease in $E_1$ is required to initiate a downcount by counter 136 by switching the state of amplifier 116 from low to high than to initiate an upcount by an increase in $E_1$, i.e., changing the state of amplifier 118 from low to high.

Figure 3A:
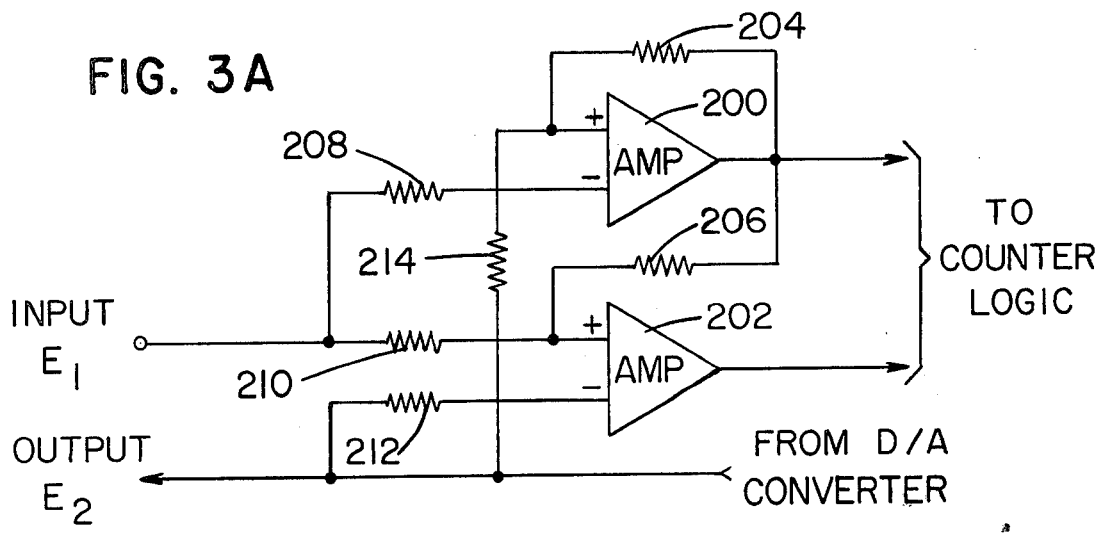
FIGS. 3A, 3B and 3C are alternative embodiments of the gain hysteresis circuit of the present invention described with reference to FIG. 2.
Figure 3B:
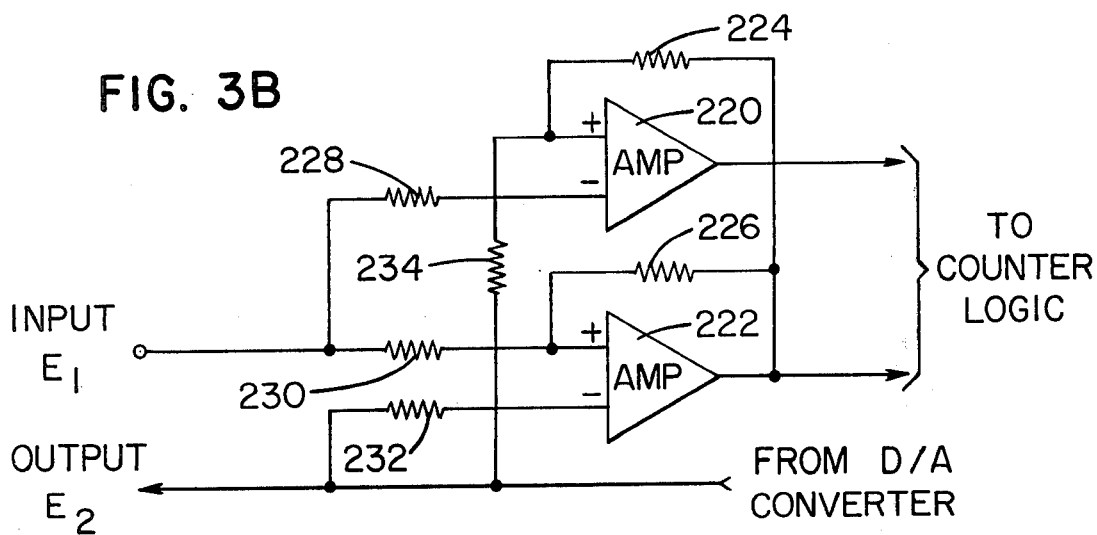
Figure 3C:
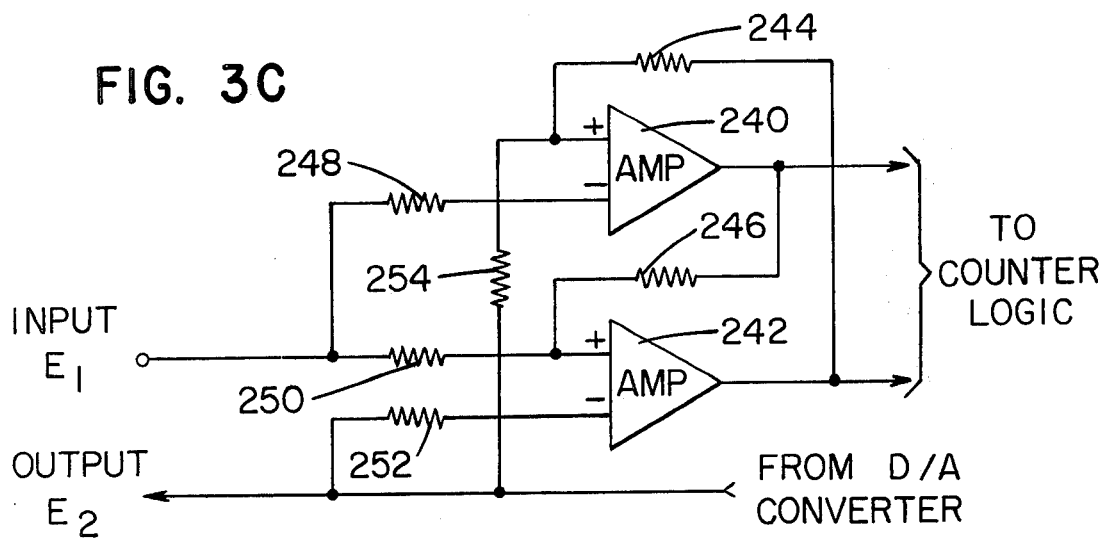

Referring now to FIGS. 3A, 3B and 3C, alternative configurations of the gain hysteresis loops described with reference to FIG. 2 are illustrated. The gain hysteresis circuits of FIGS. 3A, 3B and 3C are operationally similar to that described with reference to FIG. 2, with amplifier/comparators 200 and 202 of FIG. 3A corresponding to amplifiers 116 and 118, amplifier/comparators 220 and 222 of FIG. 3B corresponding to amplifiers 116 and 118 and amplifier/comparators 240 and 242 of FIG. 3C also corresponding to amplifiers 116 and 118. Operationally, in each of the circuit configurations illustrated by FIGS. 3A, 3B and 3C, the digitized output $E_2$ will stabilize at different values and the initial state (high or low) of the amplifiers 200 and 206 of FIG. 3A, 220 and 222 of FIG. 3B and 240 and 242 of FIG. 3C may be different to initiate or stop a count by the respective up/down counter, although amplifiers 200 of FIG. 3A, 220 of FIG. 3B and 240 of FIG. 3C must be in the low state for an up-count and high for a down-count by the respective associated counters. The total gain hysteresis range is approximately the same for each of the illustrated circuits, however, the embodiments illustrated by FIGS. 3A and 3B will tolerate larger incremental changes in the digitized output $E_2$ without both amplifiers 200 and 202 of the circuit of FIG. 3A and amplifiers 220 and 222 of the circuit of FIG. 3B changing states under conditions of large variation in the input $E_1$.

The value of the digitized output $E_2$ for the configuration illustrated by FIG. 3A will exceed $E_1$ by a value dependent upon the magnitude of the output of amplifier 202, $E_1$ itself and the gain hysteresis feedback factor $M$ where:

$$M = R210/R206 = R214/R204$$

Appropriate biasing is provided by resistors 212 and 108.

The value of the digitized output $E_2$ for the configuration illustrated by FIG. 3B will exceed $E_1$ by a value dependent upon the magnitude of the output of amplifier 220, $E_1$ itself and the gain hysteresis feedback factor M where:

$$M = R230/R226 = R234/R224$$

Appropriate biasing is provided by resistors 232 and 228.

The value of the digitized output $E_2$ for the configuration illustrated by FIG. 3C will exceed $E_1$ by a value dependent upon the magnitude of the output of amplifier 242, $E_1$ itself and the gain hysteresis feedback factor M where:

$$M = R250/R246 = R254/R244$$

Appropriate biasing is provided by resistors 254 and 248.

While the invention has been shown and described with reference to preferred embodiments thereof, it will be understood that persons skilled in the art may make modifications thereof without departing from the spirit and scope of the invention as defined by the claims appended hereto.

What is claimed is:

1. A circuit for providing rapid automatic gain control for large variations in an input signal coupled thereto while concurrently preserving a predetermined low level modulation on said input signal at the output of said circuit, comprising:
   AGC amplifier means having said input signal coupled thereto and having at least one output;
   means for detecting said amplifier output and for deriving an output variable in amplitude with said detected amplifier output;
   means for deriving a control voltage variable in discrete incremental steps in response to said detector output when said detector output variation exceeds a predetermined level;
   means for coupling said control voltage to said AGC amplifier to provide automatic gain control,
   said means for deriving a control voltage further comprising:
   comparator means having two stable states and having a predetermined gain hysteresis range for changing from one of said stable states to the other of said stable states when said detector output variation exceeds said gain hysteresis range, and having an output;
   means for deriving a clock input;
   counter means;
   logic means responsive to said comparator output for gating said clock to said counter means;
   digital to analog converter means responsive to said counter for incrementally increasing or decreasing said control voltage in discrete steps; and
   a feedback loop for sensing the output of said digital to analog converter and coupling said output to the reference input of said comparator.

2. A circuit in accordance with claim 1 wherein the comparator output is a bipolar signal and wherein said counter comprises an up/down counter for counting up when said bipolar signal is of one polarity and for counting down when said bipolar signal is of the opposite polarity.

3. A circuit in accordance with claim 1 wherein said comparator means include:
   first and second amplifiers each having inverting and noninverting inputs and each having a respective gain hysteresis loop.

4. A circuit in accordance with claim 3 wherein said gain hysteresis loops are resistive.

5. A circuit in accordance with claim 3 wherein said logic means includes:
   means for inhibiting said clock input from said counter when the outputs of said first and second amplifiers are of like polarity and for gating said clock to said counter when said first and second amplifier outputs are of opposite polarity.

6. A circuit in accordance with claim 5 wherein the output of said digital to analog converter is incremented by one least significant bit at a time unless said detector output signal variation is present for a time duration greater than the clock period.

7. In a digitized AGC amplifier having a gain control input for gain controlling large input signal level changes while preserving a low frequency amplitude modulation, the improvement comprising:
   means for detecting said input signal and having an output;
   comparator means having said detector output coupled thereto and having two stable states and having a predetermined gain hysteresis range for changing from one of said stable states to the other of said stable states when said detector output variation exceeds said gain hysteresis range, and having an output;
   means for deriving a clock input;
   counter means;
   logic means responsive to said comparator output for gating said clock to said counter means;
   digital to analog converter means responsive to said counter for incrementally increasing or decreasing an analog control voltage in discrete steps; and
   a feedback loop for sensing said analog control voltage and coupling said voltage to the reference input of said comparator and to the gain control input of said AGC amplifier.

8. A circuit in accordance with claim 7 wherein said comparator output is a bipolar signal and wherein said counter comprises an up/down counter for counting up when said bipolar signal is of one polarity and for counting down when said bipolar signal is of the opposite polarity.

9. A circuit in accordance with claim 8 wherein said comparator means includes:
   first and second amplifiers, each of said amplifiers having inverting and non-inverting inputs and each having a respective gain hysteresis loop.

10. A circuit in accordance with claim 9 wherein said logic means includes:
    means for inhibiting said clock input from said counter when the outputs of said first and second amplifiers are of like polarity and for gating said clock to said counter when said first and second amplifier outputs are of opposite polarity.

* * * * *